United States Patent
Kim et al.

(10) Patent No.: US 12,356,585 B2
(45) Date of Patent: Jul. 8, 2025

(54) COOLING MODULE FOR PROVIDING ENHANCED LOCALIZED COOLING OF A HEATSINK

(71) Applicant: ABACO SYSTEMS, INC., Huntsville, AL (US)

(72) Inventors: Joo Han Kim, Huntsville, AL (US); Lucius Akalanne, Wiltshire (GB); Brian Hoden, Albuquerque, NM (US)

(73) Assignee: ABACO SYSTEMS, INC., Huntsville, AL (US)

(*) Notice: Subject to any disclaimer, the term of this patent is extended or adjusted under 35 U.S.C. 154(b) by 165 days.

(21) Appl. No.: 18/265,059

(22) PCT Filed: Dec. 23, 2020

(86) PCT No.: PCT/US2020/066758
§ 371 (c)(1),
(2) Date: Jun. 2, 2023

(87) PCT Pub. No.: WO2022/139829
PCT Pub. Date: Jun. 30, 2022

(65) Prior Publication Data
US 2024/0032255 A1    Jan. 25, 2024

(51) Int. Cl.
*H05K 7/20* (2006.01)
*H01L 23/473* (2006.01)

(52) U.S. Cl.
CPC ..... *H05K 7/20254* (2013.01); *H05K 7/20509* (2013.01); *H05K 7/20518* (2013.01); *H01L 23/473* (2013.01); *H05K 7/20772* (2013.01)

(58) Field of Classification Search
CPC ........... H05K 7/20254; H05K 7/20518; H05K 7/20772; H01L 23/473
See application file for complete search history.

(56) References Cited

U.S. PATENT DOCUMENTS 5,270,572 A    12/1993    Nakajima et al.
5,576,932 A    11/1996    Bishop et al.
(Continued)

FOREIGN PATENT DOCUMENTS

EP    2151863 A1    2/2010
EP    3 723 464 A1    10/2020
(Continued)

OTHER PUBLICATIONS

PCT Application No. PCT/US2020/066758, International Search Report and Written Opinion, issued Sep. 28, 2021.
(Continued)

*Primary Examiner* — Zachary Pape
(74) *Attorney, Agent, or Firm* — Meunier Carlin & Curfman LLC

(57) ABSTRACT

A cooling module comprising a porous media that is at least partially inserted into a coolant channel of a heatsink. Generally the coolant is a liquid, though in some instances it may be a gas. More specific, a cooling module for providing enhanced localized cooling of a heatsink comprising a porous media having a volume and a seal plate connected to the porous media, wherein a portion of the volume of the porous media extends through a wall and/or a heatframe of the heatsink into a coolant channel such that coolant flows through the porous media extending into the coolant channel. The seal plate provides a seal for the wall and/or the heatframe so that the coolant does not flow out the wall and/or the heatframe. The seal plate provides enhanced localized cooling to a heat producing device that is at least in partial contact with the seal plate.

15 Claims, 8 Drawing Sheets

FIG. 2G

(56) References Cited

U.S. PATENT DOCUMENTS

| | | | |
|---|---|---|---|
| 7,044,199 B2* | 5/2006 | Thayer | H01L 23/473 257/E23.098 |
| 7,149,084 B2 | 12/2006 | Matsushima et al. | |
| 7,149,087 B2 | 12/2006 | Wilson et al. | |
| 8,174,826 B2 | 5/2012 | El-Essawy et al. | |
| 11,031,312 B2* | 6/2021 | Poltorak | H01L 23/367 |
| 11,428,478 B2* | 8/2022 | Zhou | H05K 7/20927 |
| 11,985,795 B2* | 5/2024 | Moriuchi | H05K 7/20272 |
| 2002/0108743 A1* | 8/2002 | Wirtz | H01L 23/3733 257/722 |
| 2002/0112847 A1 | 8/2002 | Nakahama | |
| 2002/0185260 A1 | 12/2002 | Calaman et al. | |
| 2005/0083655 A1* | 4/2005 | Jairazbhoy | H01L 23/3733 257/E23.098 |
| 2005/0111188 A1* | 5/2005 | Bhattacharya | H01L 23/427 361/708 |
| 2006/0157225 A1* | 7/2006 | Martin | H01L 23/473 257/E23.098 |
| 2007/0124934 A1* | 6/2007 | Peng | F28F 13/003 257/E23.098 |
| 2008/0104970 A1 | 5/2008 | Suzuki | |
| 2008/0166492 A1* | 7/2008 | Lu | H01L 23/473 257/E23.09 |
| 2008/0179046 A1* | 7/2008 | Hisano | F28F 13/003 165/104.11 |
| 2012/0175094 A1 | 7/2012 | Rice | |
| 2012/0325436 A1 | 12/2012 | Shedd | |
| 2013/0233523 A1 | 9/2013 | Parida | |
| 2014/0190669 A1 | 7/2014 | Hoshino et al. | |
| 2016/0118317 A1 | 4/2016 | Shedd | |
| 2019/0341327 A1 | 11/2019 | Teysseyre | |
| 2020/0100351 A1* | 3/2020 | Raymond | H05K 7/20163 |

FOREIGN PATENT DOCUMENTS

| | | | |
|---|---|---|---|
| GB | 2536689 A | 9/2016 | |
| WO | WO-9906782 A1 * | 2/1999 | F28F 13/003 |

OTHER PUBLICATIONS

International Preliminary Report on Patentability for International Application No. PCT/US2020/066758 dated Jul. 6, 2023.

International Search Report and Written Opinion for International Application No. PCT/US2020/8066759 dated Sep. 28, 2021.

International Preliminary Report on Patentability for International Application No. PCT/US2020/8066759 dated July 6, 2023.

Elma Adds Liquid Flow Through (LFT) Cooling to Open VPX Development Platform (Year : 2018).

Non-Final Office Action in connection to U.S. Appl. No. 18/265,062, dated Mar. 25, 2025.

* cited by examiner

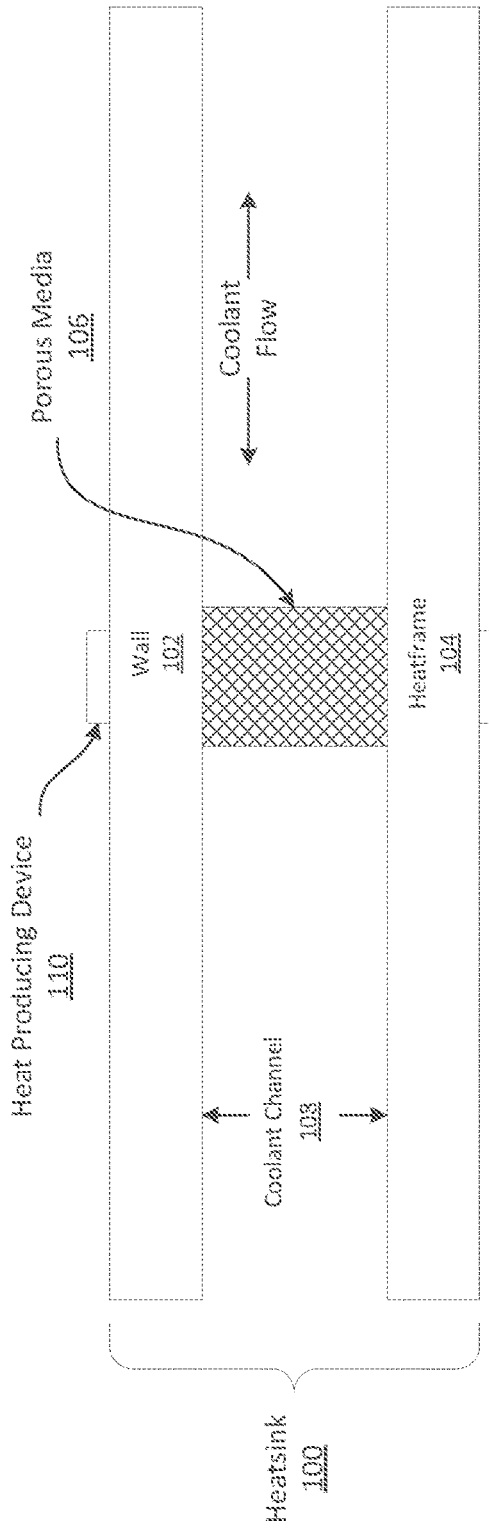
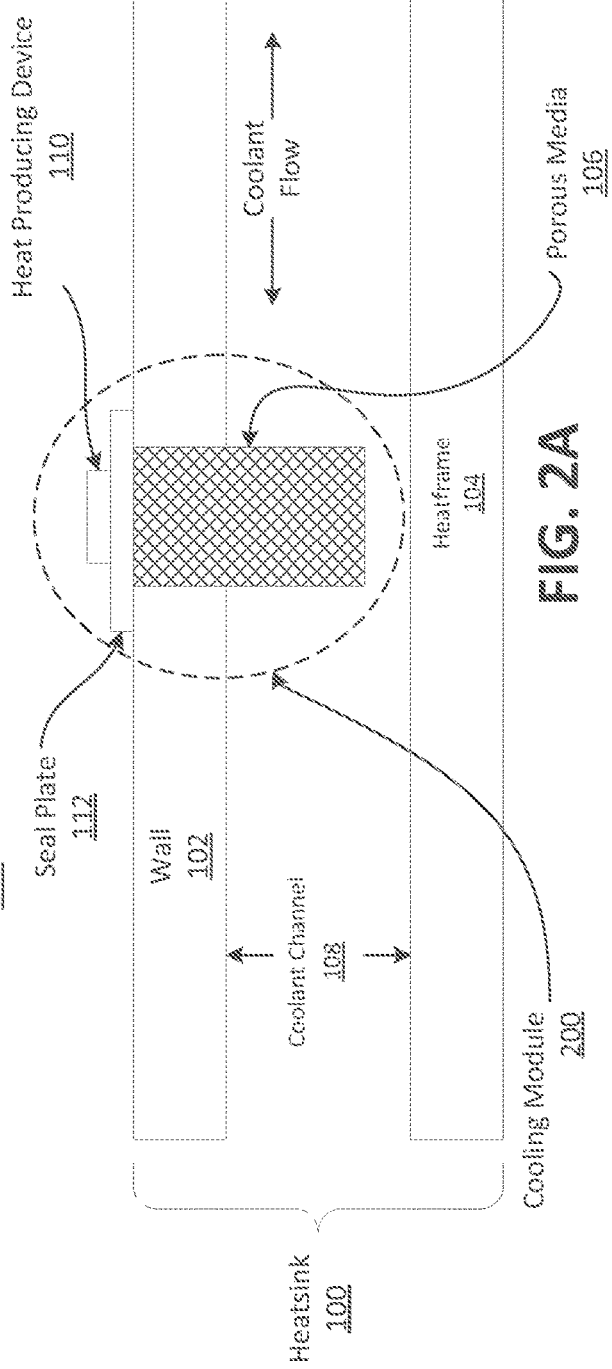

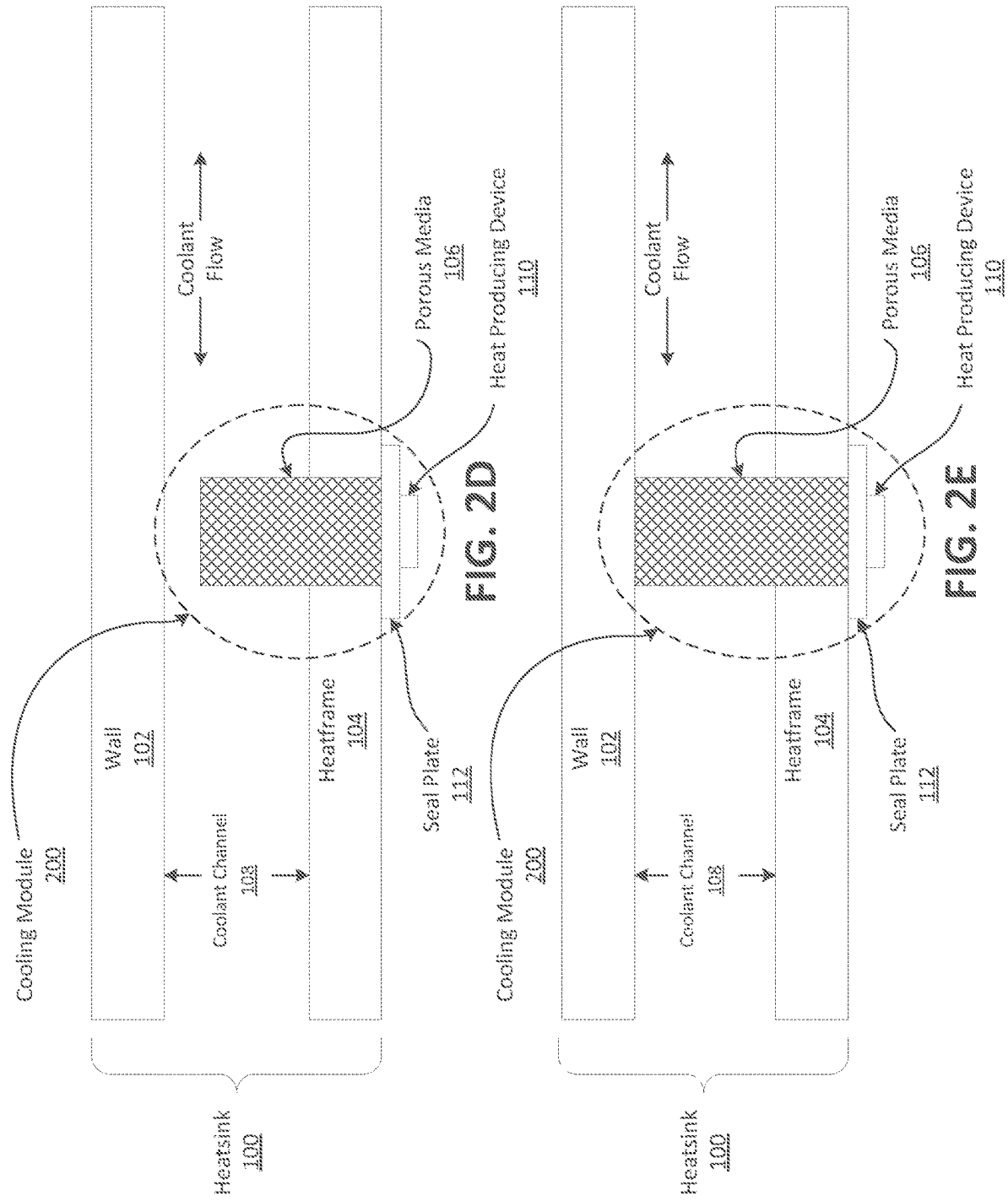

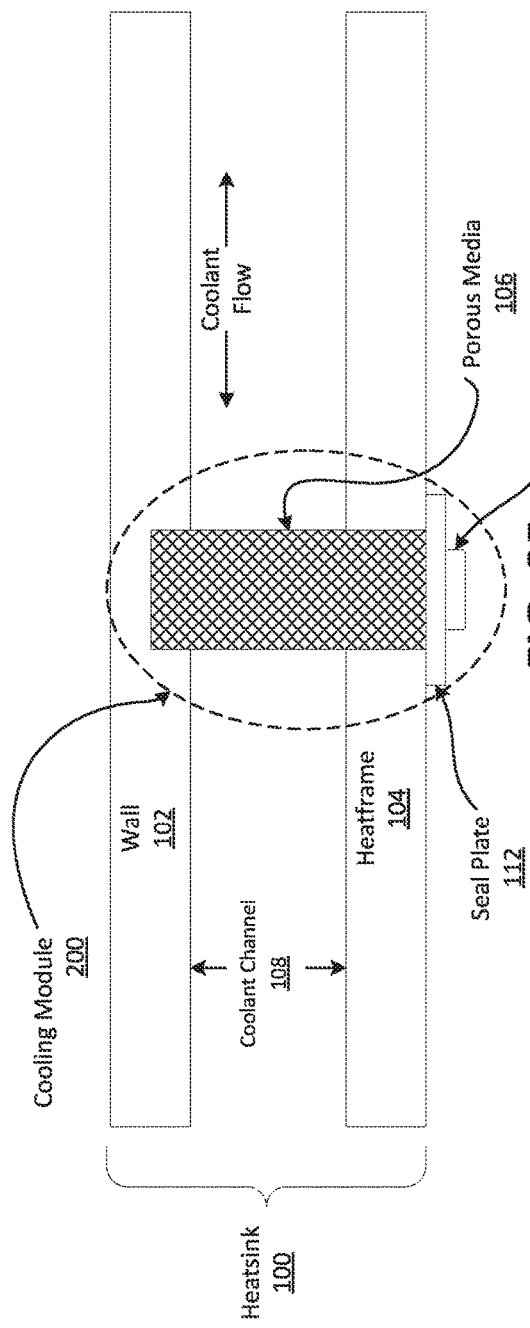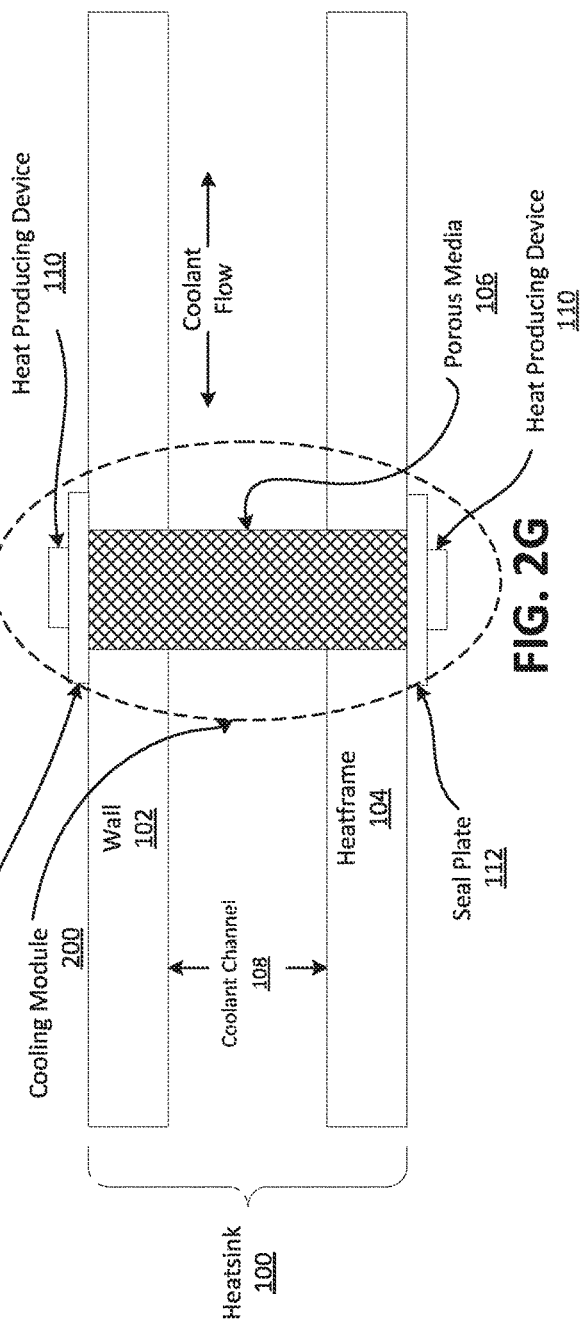

COOLING MODULE FOR PROVIDING ENHANCED LOCALIZED COOLING OF A HEATSINK

TECHNICAL FIELD

The subject matter described herein relates generally to heatsinks and, more particularly, to a cooling module for use with a heatsink, where the cooling module provides localized enhanced cooling of a portion of the heatsink.

BACKGROUND

Printed circuit boards (PCBs or PC boards) used in many electronic devices on which at least one chip (or other electronic component) is mounted generate significant amounts of heat. Such heat, if not managed, can lead to failure of the critical components that form the PCB. Prior attempts at cooling PCBs include forced air, heat pipes, heatsinks, cold plates, and the like, each have varying levels of success, but each with their own drawbacks. For example, forced air cooling may not be useful in high pollution environments and/or environments with dust or explosive gasses. Heatsinks are effective passive means for cooling electronic components on a PCB, but a typical heatsink cools each component on a PCB equally even though each component may not produce the same amount of heat. Cold plates do not target specific heat producing devices and in some instances may have unwanted pressure drop across the coolant channel.

Therefore, devices and systems are desired that overcome challenges in the art, some of which are described above. Furthermore, it is desired to have a cooling module that complies with the ANSI/VITA 48.4 Liquid Flow Through VPX Plug-In Module standard, which is fully incorporated by reference. This standard establishes the mechanical design requirements for a liquid flow-through (LFT) cooled electronic VPX module. The standard is available at https://www.vita.com/Standards. VPX, also known as VITA 46, is an ANSI standard (ANSI/VITA 46.0-2019) that provides VMEbus-based systems with support for switched fabrics over a new high speed connector. VITA is the VME International Trade Association, and ANSI is the American National Standards Institute.

SUMMARY

Disclosed and described herein are devices and systems that remove heat from heat producing devices using localized enhanced cooling of a portion of a heatsink. The devices and systems comprise a cooling module comprised of a porous media that is at least partially inserted into a coolant channel of a heatsink. Generally the coolant is a liquid, though in some instances it may be a gas. More specifically, described and disclosed herein are embodiments of a cooling module for providing enhanced localized cooling of a portion (or portions) of heatsink comprising a porous media having a volume and a seal plate connected to the porous media, wherein a portion of the volume of the porous media extends through a wall and/or a heatframe of the heatsink into a coolant channel such that coolant flows through the porous media extending into the coolant channel. The seal plate provides a seal for the wall and/or the heatframe so that the coolant does not flow out the wall and/or the heatframe. The seal plate provides an area of enhanced localized cooling to a heat producing device (e.g., electronic circuits and chips) that is at least in partial contact with the seal plate.

In one aspect, embodiments of a heatsink having areas of localized enhanced cooling are described herein. For example, one embodiment comprises a heatsink having a wall, a heatframe, and a coolant channel between the wall and the heatframe, wherein a coolant flows through the coolant channel. Providing the localized enhanced cooling is a porous media having a volume, wherein at least a portion of the volume of the porous media extends into the coolant channel such that at least some of the coolant flows through the portion of the porous media extending into the coolant channel. The wall and/or the heatframe proximate to the porous media provides enhanced localized cooling to at least a portion of a heat producing device that is at least in partial contact with the wall or the heatframe proximate to the porous media.

In some instances, the heatsink described above comprises one or more seal plates, wherein the porous media extends through the wall and/or the heatframe and the one or more seal plate provides a seal for the wall and/or the heatframe so that the coolant does not flow through the porous media and out the wall and/or the heatframe. Generally, the seal plates are comprised of thermally-conductive material such as copper, though other materials are contemplated (e.g., aluminum, steel, silver, gold, etc.). The one or more seal plates proximate to the porous media provide enhanced localized cooling to at least a portion of the heat producing device that is at least in partial contact with the one or more seal plates proximate to the porous media.

In some instances, the porous media extends through the wall, through the coolant channel and partially into the heatframe, wherein the one or more seal plates comprises one wall seal plate that seals the wall so that the coolant does not flow through the porous media and out the wall. The wall seal plate is welded, soldered, brazed, glued, screwed, compression fit, or otherwise attached to the wall to form the seal. In some instances, a gasket of appropriate material may be located between the wall seal plate and the wall.

Alternatively or optionally, the porous media extends through the heatframe, through the coolant channel and partially into the wall, wherein the one or more seal plates comprises one heatframe seal plate that seals the heatframe so that the coolant does not flow through the porous media and out the heatframe. The heatframe seal plate is welded, soldered, brazed, glued, screwed, compression fit, or otherwise attached to the heatframe to form the seal. In some instances, a gasket of appropriate material may be located between the heatframe seal plate and the heatframe.

Alternatively or optionally, the porous media extends through the heatframe, through the coolant channel and through the wall of the heatsink, wherein the one or more seal plates seals the heatframe and the wall so that the coolant does not flow through the porous media and out the heatframe or out the wall. The one or more seal plates are welded, soldered, brazed, glued, screwed, compression fit, or otherwise attached to the wall and the heatframe to form the seals. In some instances, a gasket of appropriate material may be located between the seal plate and the wall and/or the heatframe.

Generally, the porous media is comprised of thermally-conductive material. For example, the thermal-conductivity rating of the porous media may be equal to or greater than 150 W/mK Further, the porous media causes turbulence in the flow of coolant through it. For example, the porous media may be comprised of a 3D printed metal porous media, a metal foam, a wire mesh, and the like. In some instances, the porous media is comprised of aluminum foam. Generally, the porous media has a heat transfer coefficient of 20,000 W/m²K, or greater.

As noted herein, the porous media provides enhanced localized cooling to at least a portion of a heat producing device that is at least in partial contact with the wall or the heatframe proximate to the porous media. The enhanced localized cooling of the heatsink may occur in an area of from (and including) 100 mm² to (and including) 2500 mm².

Generally, the heat producing device described herein comprises an electronic device, though in some instances it may a device that cause heat through mechanical action. For example, the electronic device may comprise one or more of a central processing unit (CPU), a graphics processing unit (GPU), a field-programmable gate array (FPGA), a platform control hub (PCH), a PCI express switch, and the like.

In some instances, the coolant may be a gas (ambient, compressed, or refrigerated), while in other instances the coolant may be a liquid. For example, the heatsink may be in compliance with a ANSI/VITA 48.4 Liquid Flow Through VPX Plug-In Module standard.

Other embodiments described herein comprise a cooling module for providing enhanced localized cooling of a portion of a heatsink. The module comprises a porous media having a volume; and a seal plate connected to the porous media, wherein at least a portion of the volume of the porous media extends through a wall and/or a heatframe of the heatsink into a coolant channel of a heatsink that is located between the wall and the heatframe of the heatsink such that at least some of the coolant flows through the portion of the porous media extending into the coolant channel, wherein the seal plate provides a seal for the wall and/or the heatframe so that the coolant does not flow through the porous media and out the wall and/or the heatframe, and wherein the seal plate connected to the porous media provides enhanced localized cooling to at least a portion of a heat producing device that is at least in partial contact with the seal plate.

Additional and/or alternative features of the cooling module are described above.

Additional advantages will be set forth in part in the description which follows or may be learned by practice. The advantages will be realized and attained by means of the elements and combinations particularly pointed out in the appended claims. It is to be understood that both the foregoing general description and the following detailed description are exemplary and explanatory only and are not restrictive, as claimed.

BRIEF DESCRIPTION OF THE DRAWINGS

The accompanying drawings, which are incorporated in and constitute a part of this specification, illustrate embodiments and together with the description, serve to explain the principles of the methods and systems:

FIG. 1C is a cross-section view of a heatsink having a porous media in a portion of the coolant channel of the heatsink with the porous media extending from the wall to the heatframe such that the porous media is proximate to a portion of the wall of the heatsink and proximate to a portion of the heatframe of the heatsink;

FIG. 2A is a cross-section view of a cooling module comprised of a porous media and a seal plate where the porous media extends through the wall and into a portion of the coolant channel of the heatsink with the porous media proximate to the wall seal plate of the heatsink;

FIG. 2D is a cross-section view of a cooling module comprised of a porous media and a seal plate where the porous media extends through the heatframe and into a portion of the coolant channel of the heatsink with the porous media proximate to the heatframe seal plate of the heatsink;

FIG. 2E is a cross-section view of a cooling module comprised of a porous media and a seal plate where the porous media extends through the heatframe and across a portion of the coolant channel of the heatsink to the wall, with the porous media proximate to the heatframe seal plate of the heatsink;

FIG. 2F is a cross-section view of a cooling module comprised of a porous media and a seal plate where the porous media extends through the heatframe and across a portion of the coolant channel of the heatsink and partially into the wall, with the porous media proximate to the heatframe seal plate of the heatsink;

FIG. 2G is a cross-section view of a cooling module comprised of a porous media and seal plates where the porous media extends through the wall and across a portion of the coolant channel of the heatsink and through the heatframe, with the porous media proximate to the wall seal plate of the heatsink and the heatframe seal plate of the heatsink;

DETAILED DESCRIPTION

Figure 1A:
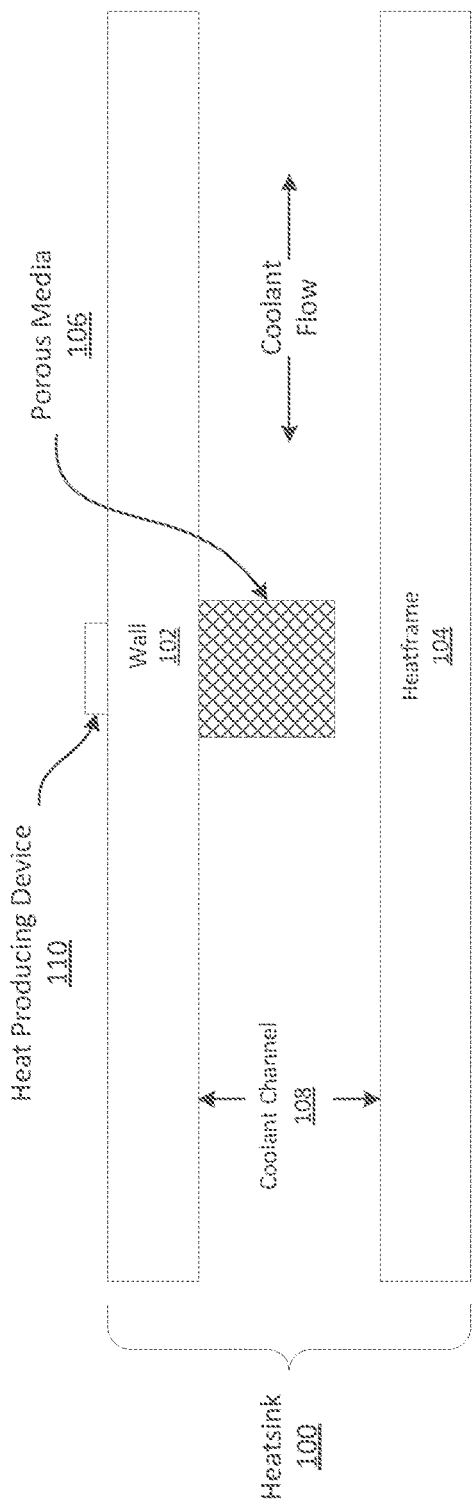
FIG. 1A is a cross-section view of a heatsink having a porous media in a portion of the coolant channel of the heatsink with the porous media proximate to the wall of the heatsink.

Before the present methods and systems are disclosed and described, it is to be understood that the methods and systems are not limited to specific synthetic methods, specific components, or to particular compositions. It is also to be understood that the terminology used herein is for the purpose of describing particular embodiments only and is not intended to be limiting.

As used in the specification and the appended claims, the singular forms "a," "an" and "the" include plural referents unless the context clearly dictates otherwise. Ranges may be expressed herein as from "about" one particular value, and/or to "about" another particular value. When such a range is expressed, another embodiment includes from the one particular value and/or to the other particular value. Similarly, when values are expressed as approximations, by use of the antecedent "about," it will be understood that the particular value forms another embodiment. It will be further understood that the endpoints of each of the ranges are significant both in relation to the other endpoint, and independently of the other endpoint.

"Optional" or "optionally" means that the subsequently described event or circumstance may or may not occur, and that the description includes instances where said event or circumstance occurs and instances where it does not.

Throughout the description and claims of this specification, the word "comprise" and variations of the word, such as "comprising" and "comprises," means "including but not limited to," and is not intended to exclude, for example, other additives, components, integers or steps. "Exemplary" means "an example of" and is not intended to convey an indication of a preferred or ideal embodiment. "Such as" is not used in a restrictive sense, but for explanatory purposes.

Disclosed are components that can be used to perform the disclosed methods and systems. These and other components are disclosed herein, and it is understood that when combinations, subsets, interactions, groups, etc. of these components are disclosed that while specific reference of each various individual and collective combinations and permutation of these may not be explicitly disclosed, each is specifically contemplated and described herein, for all methods and systems. This applies to all aspects of this application including, but not limited to, steps in disclosed methods. Thus, if there are a variety of additional steps that can be performed it is understood that each of these additional steps can be performed with any specific embodiment or combination of embodiments of the disclosed methods.

The present methods and systems may be understood more readily by reference to the following detailed description of preferred embodiments and the Examples included therein and to the Figures and their previous and following description.

The embodiments disclosed herein facilitate providing enhanced localized cooling in areas of a heatsink. As shown at least in FIG. 1A, a heatsink 100 is comprised of a wall 102 and a heatframe 104, with one or more coolant channels 108 sandwiched between the wall 102 and the heatframe 104. Generally, the coolant channels 108 form a closed loop, so it is to be appreciated that the drawings herein show only a cross-sectional view of the heatsink 100. In some instances, cooling fins (not shown) may be located on portions of the heatsink 100 and would generally be located on a portion of the exterior of the wall and/or the heatframe.

Further comprising the heatsink 100 of FIG. 1A is a cooling module comprised of porous media 106. As shown in FIG. 1A, in this embodiment the porous media 106 has a volume, and at least a portion of the volume of the porous media 106 extends into a portion of at least one of the coolant channels 108. Generally, the porous media 106 is comprised of thermally-conductive material. For example, the thermal-conductivity rating of the porous media 106 may be equal to or greater than 150 W/mK. The porous media 106 may have any volumetric shape including a cube, a cylinder, a sphere, and the like. The porous media 106 is comprised of materials that cause a turbulence (i.e., non-laminar flow) in the flow of coolant in the coolant channel 108 through the portion of the porous media extending into the coolant channel 108. For example, the porous media 106 may be comprised of a 3D printed metal porous media, a metal foam, a wire mesh, and the like. In one non-limiting example, the porous media 106 is comprised of aluminum foam. In one example, the heatsink 100 with the cooling module comprised of the porous media 106 may be 3D-printed as one piece.

Also shown in FIG. 1A is a heat producing device 110. The enhanced localized cooling caused by the cooling module in the heatsink 100 is used to cool the heat producing device. In some instances, the heat producing device 110 is at least in partial contact with the wall 102 or the heatframe 104 proximate to the porous media 106, such that enhanced localized cooling is provided to the heat producing device 110. Generally, the heat producing device 110 is an electronic device such as, for example, one or more of a central processing unit (CPU), a graphics processing unit (GPU), a field-programmable gate array (FPGA), a platform control hub (PCH), a PCI express switch, and the like. In some instances the electronic device may be mounted on a PC board. In other instances, the heat producing device may be mechanical or chemical. The embodiments disclosed herein can be used to provide enhanced localized cooling to any form of heat producing device 110.

Figure 1B:
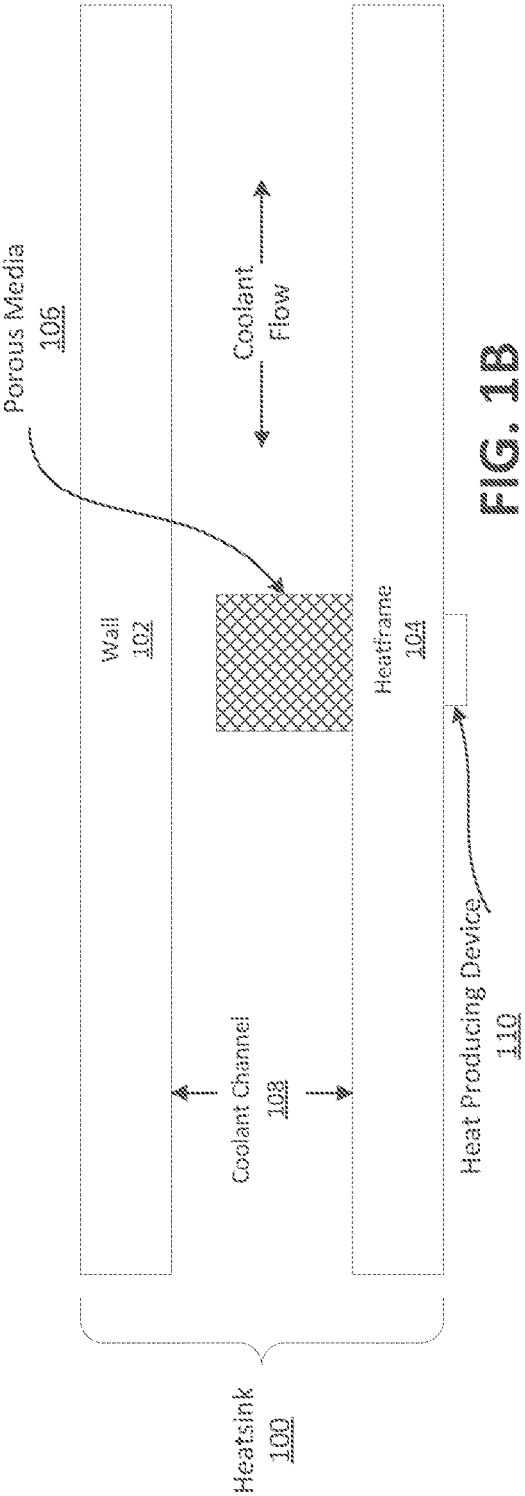
FIG. 1B is a cross-section view of a heatsink having a porous media in a portion of the coolant channel of the heatsink with the porous media proximate to the heatframe of the heatsink.

FIGS. 1B and 1C are illustrations of non-limiting variations of the embodiment of a heatsink 100 shown in FIG. 1A. FIG. 1B is a cross-section view of a heatsink 100 having a porous media 106 in a portion of the coolant channel 108 of the heatsink 108 with the porous media 106 proximate to the heatframe 104 of the heatsink 100. FIG. 1C is a cross-section view of a heatsink 100 having a porous media 106 in a portion of the coolant channel 108 of the heatsink 108 with the porous media 106 extending through at least a portion of one of the coolant channels 108 from the wall 102 to the heatframe 104 such that the porous media 106 is proximate to a portion of the wall 102 of the heatsink 100 and proximate to a portion of the heatframe 104 of the heatsink 100.

FIG. 2A is a cross-section view of a cooling module 200 in a heatsink 100 comprised of a porous media 106 and a seal plate 112 where the porous media 106 extends through the wall 102 and into a portion of the coolant channel 108 of the heatsink 100 with the porous media 106 proximate to the wall seal plate 112 of the heatsink 100. The seal plate 112 produces an area of enhanced localized cooling. The area may range from approximately 100 mm 2 to 2500 mm². Generally, a heat producing device 110 will be at least partially in contact with the seal plate 112 or at least in very close proximity to the seal plate 112. Furthermore, the wall seal plate 112 seals the wall 102 so that the coolant does not flow through the porous media 106 and out the wall 102. The seal plate 112 may be comprised of copper, aluminum, silver and other thermally-conductive materials. The wall seal plate 112 may welded, soldered, brazed, glued, compression fit, screwed, or use any other attachment means to attach to the wall 102 to form the seal. In some instances, a gasket may be used between the wall 102 and the wall seal plate 112. This is better shown in FIGS. 3A and 3B.

Figure 2B:
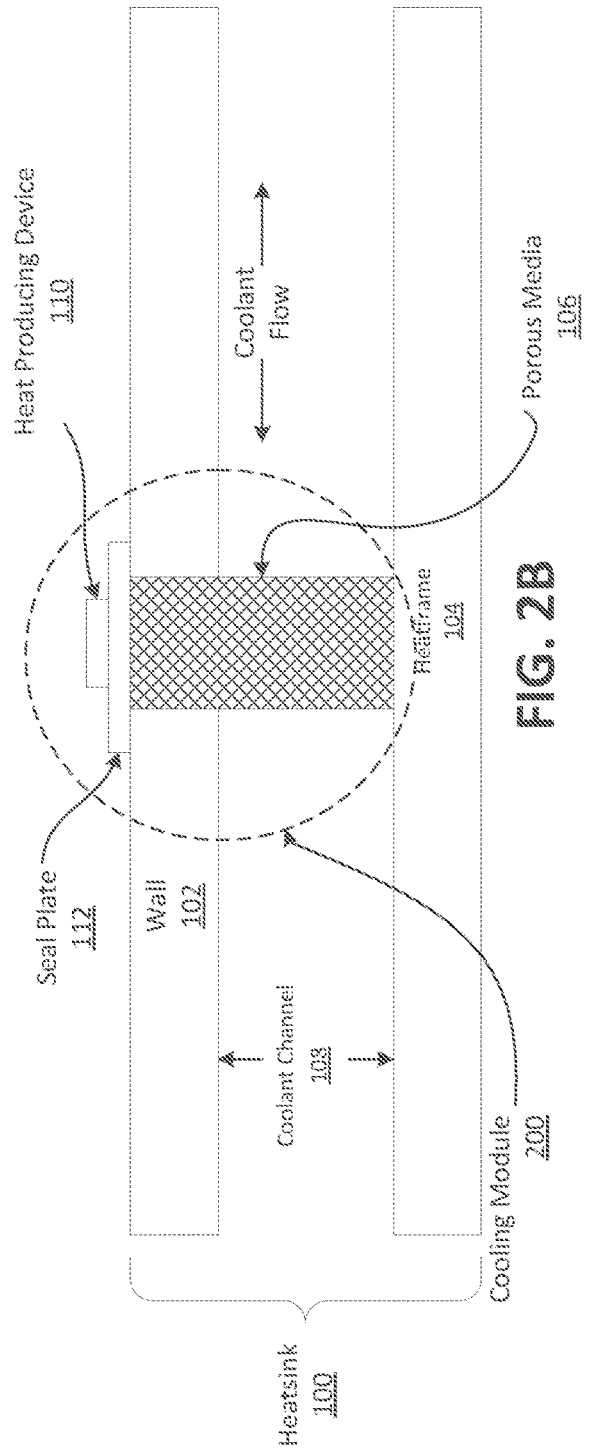
FIG. 2B is a cross-section view of a cooling module comprised of a porous media and a seal plate where the porous media extends through the wall and across a portion of the coolant channel of the heatsink to the heatframe, with the porous media proximate to the wall seal plate of the heatsink.

FIG. 2B is a variant of the heatsink 100 with a cooling module 200 shown in FIG. 2A. FIG. 2B illustrates a cross-section view of a cooling module 200 in a heatsink 100 comprised of a porous media 106 and a seal plate 112 where the porous media 106 extends through the wall 102 and across a portion of the coolant channel 108 of the heatsink 100 to the heatframe 104, with the porous media 106 proximate to the wall seal plate 112 of the heatsink 100.

Figure 2C:
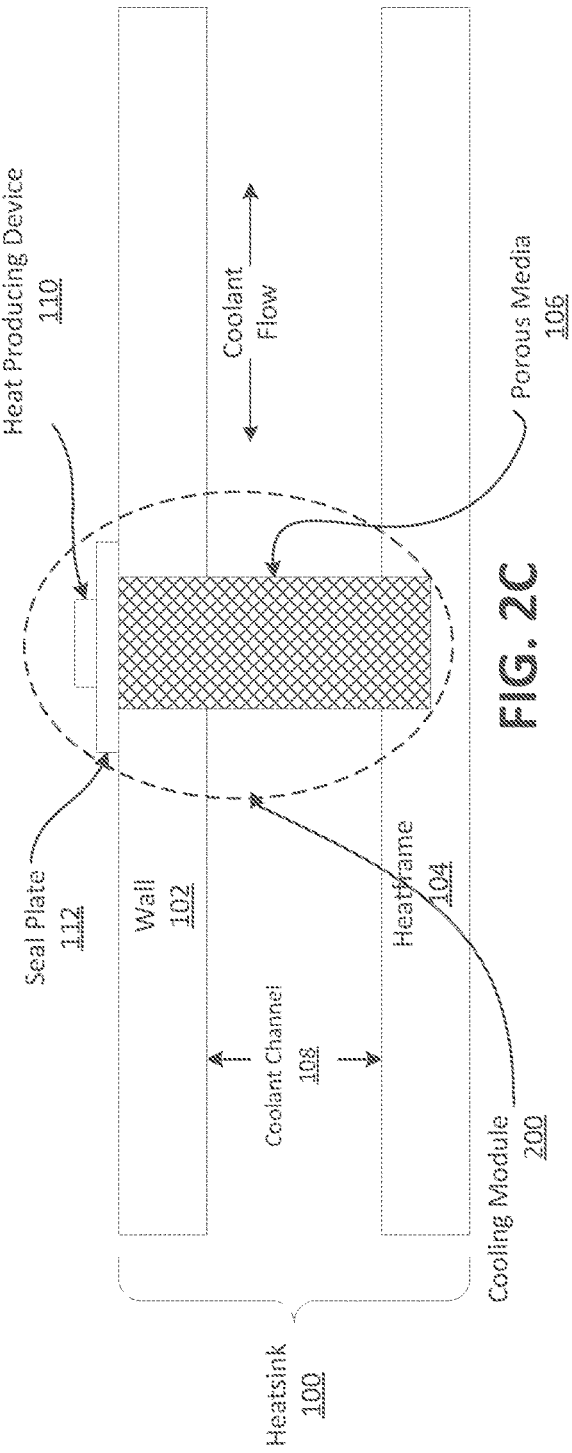
FIG. 2C is a cross-section view of a cooling module comprised of a porous media and a seal plate where the porous media extends through the wall and across a portion of the coolant channel of the heatsink to the heatframe, and partially into the heatframe, with the porous media proximate to the wall seal plate of the heatsink.

FIG. 2C is a variant of the heatsink 100 with a cooling module 200 shown in FIGS. 2A and FIG. 2B. FIG. 2C illustrates a cross-section view of a cooling module 200 in a heatsink 100 comprised of a porous media 106 and a seal plate 112 where the porous media 106 extends through the wall 102, across a portion of the coolant channel 108 of the heatsink 100, and partially into the heatframe 104, with the porous media 106 proximate to the wall seal plate 112 of the heatsink 100.

FIG. 2D is a cross-section view of a cooling module 200 comprised of a porous media 106 and a seal plate 112, where the porous media 106 extends through the heatframe 104 and into a portion of the coolant channel 108 of the heatsink 100 with the porous media 106 proximate to the heatframe seal plate 112 of the heatsink 100.

FIGS. 2E and 2F are variants of the cooling module 200 shown in FIG. 2D. FIG. 2E illustrates a cross-section view of a cooling module 200 comprised of a porous media 106 and a seal plate 112, where the porous media 106 extends through the heatframe 104 and across a portion of the coolant channel 108 of the heatsink 100 to the wall 102, with the porous media 106 proximate to the heatframe seal plate 112 of the heatsink 100. FIG. 2F is an illustration of a cross-section view of a cooling module 200 comprised of a porous media 106 and a seal plate 112, where the porous media 106 extends through the heatframe 104 and across a portion of the coolant channel 108 of the heatsink 100 and partially into the wall 102, with the porous media 106 proximate to the heatframe seal plate 112 of the heatsink 100.

FIG. 2G is a cross-section view of an embodiment of a cooling module 200 comprised of a porous media 106 and two seal plates 112, where the porous media 106 extends through the wall 102 and across a portion of the coolant channel 108 of the heatsink 100 and through the heatframe 104, with the porous media 106 proximate to the wall seal plate 112 of the heatsink 100 and the heatframe seal plate 112 of the heatsink 110. In this way, areas of enhanced localized cooling are created on both sides of the heatsink 100. Such a configuration would allow one heatsink 100 to be sandwiched between two PC boards and cool heat production devices 110 on each of the PC boards.

Figure 3A:
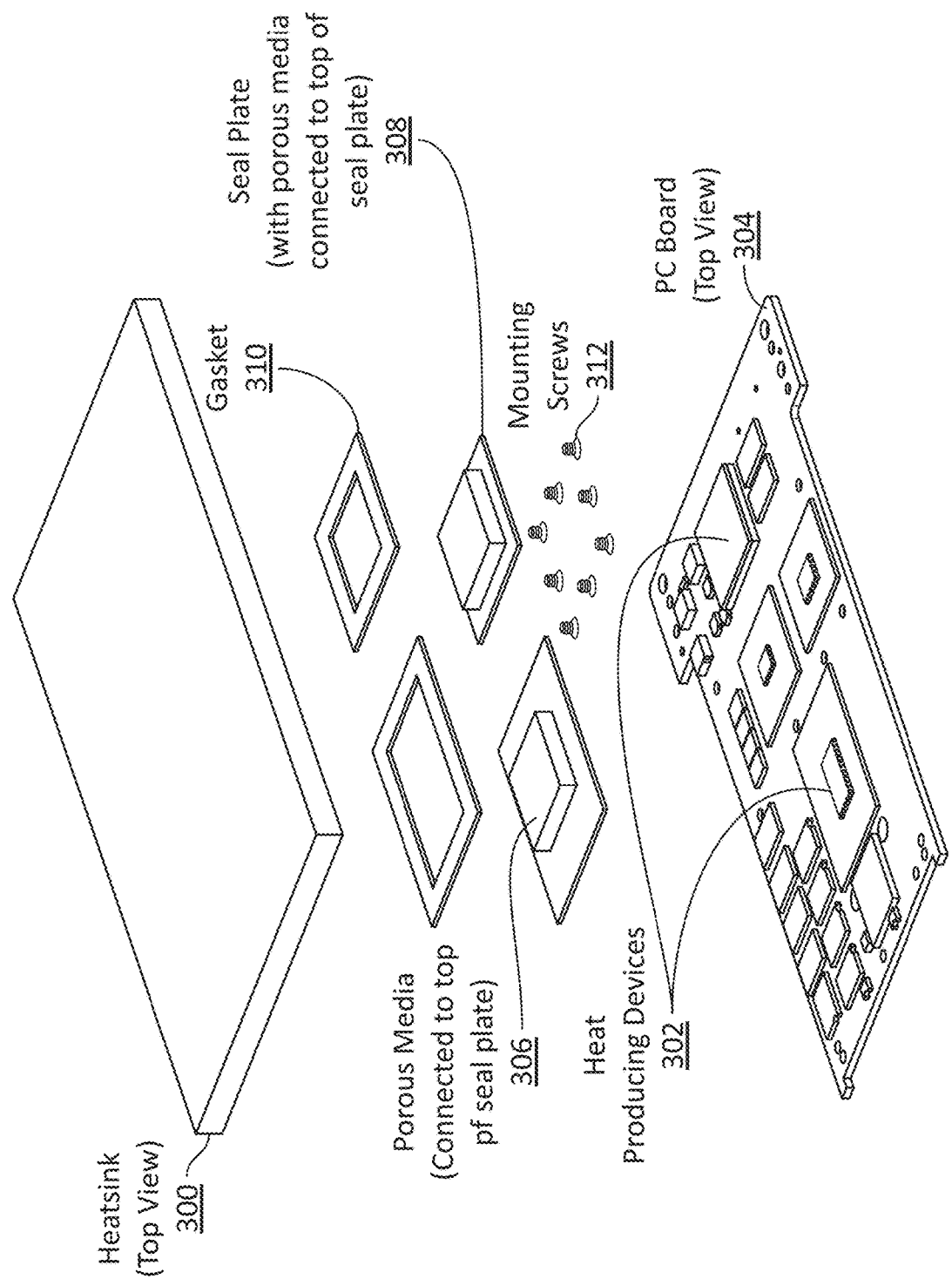
FIG. 3A is an exploded top view of a heatsink with two embedded cooling modules used to provide enhanced localized cooling for heat producing devices (e.g., electronic chips) on a PC board.
Figure 3B:
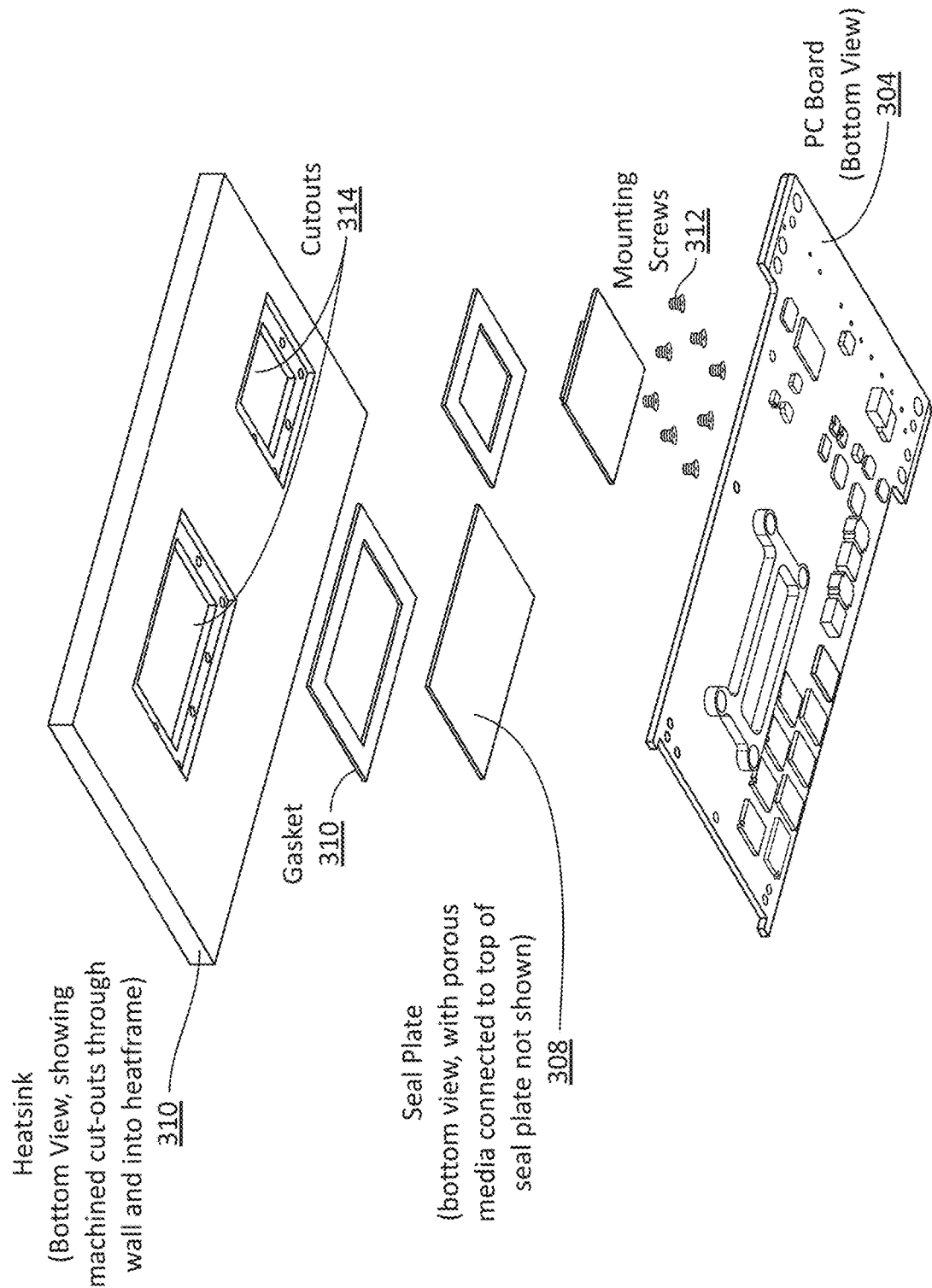
FIG. 3B is an exploded bottom view of a heatsink with two embedded cooling modules used to provide enhanced localized cooling for heat producing devices (e.g., electronic chips) on a PC board.

FIG. 3A is an exploded top view of a heatsink 300 with two embedded cooling modules used to provide enhanced localized cooling for heat producing devices 302 (e.g., electronic chips) on a PC board 304. In this embodiment, each cooling module is comprised of porous media 306 connected to a seal plate 308. In this embodiment, a gasket 310 is placed between the seal plate 308 and the heatsink 300. The cooling module comprised of the porous media 306 and seal plate 308 is attached to the heatsink using mounting screws 312. FIG. 3B is an exploded bottom view of the heatsink 300 with two embedded cooling modules used to provide enhanced localized cooling for heat producing devices 302 (e.g., electronic chips) on a PC board 304. In this view, the machined cutouts 314 that go through the heatframe and partially into the wall are visible. The porous media 306 fits into these cutouts 314 when assembled.

Figure 4:
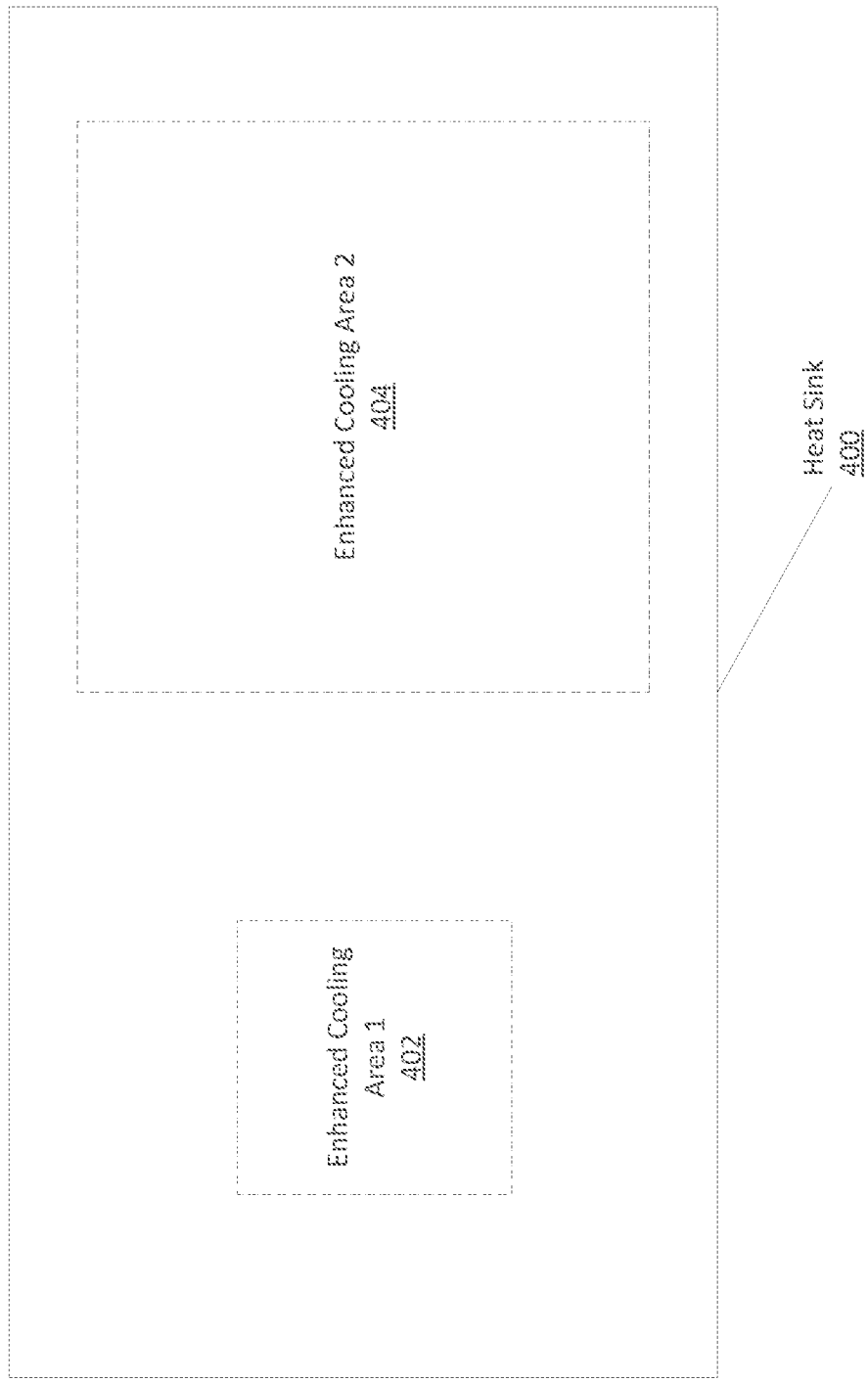
FIG. 4 is a plan view of a heatsink with two enhanced localized cooling areas.

FIG. 4 is a plan view of a heatsink 400 with two enhanced localized cooling areas 402, 404. As can be seen in FIG. 4, the size of the enhanced localized cooling areas 402, 404 can vary. Typically, the enhanced localized cooling areas 402, 404 range between approximately 100 mm$^2$ to approximately 2500 mm$^2$. This figure also illustrates that a heatsink 400 can have a plurality of cooling modules.

Benefits of the embodiments described herein include solving the downgrade of thermal performance of liquid flow through cooling solution due to its low heat transfer coefficient limited by high pressure drop or high machining cost for complex channel geometries. The disclosed cooling module provides a significantly improved heat transfer characteristics over a conventional channel cold plate heat frame at least because of a significant increase in effective liquid contact area (for example, the improvement may be 100%, or greater); a significant increase in Nusselt number thru swirling motion, turbulence, etc. (Usually, the Nusselt number for laminar flow is up to 10. The Nusselt number for conventional liquid cooling's turbulent flows is in the range of 100-150, but the reported Nusselt number for porous media flow is ~200-300); a relatively lower pressure drop than complex geometries channels (i.e. Micro-channels) (for example, porous media flow may reduce the pressure drop approximately in half); as well as lower cost and ease of manufacture.

While the methods and systems have been described in connection with preferred embodiments and specific examples, it is not intended that the scope be limited to the particular embodiments set forth, as the embodiments herein are intended in all respects to be illustrative rather than restrictive.

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is no way intended that an order be inferred, in any respect. This holds for any possible non-express basis for interpretation, including: matters of logic with respect to arrangement of steps or operational flow; plain meaning derived from grammatical organization or punctuation; the number or type of embodiments described in the specification.

Throughout this application, various publications may be referenced. The disclosures of these publications in their entireties are hereby incorporated by reference into this application in order to more fully describe the state of the art to which the methods and systems pertain.

It will be apparent to those skilled in the art that various modifications and variations can be made without departing from the scope or spirit. Other embodiments will be apparent to those skilled in the art from consideration of the specification and practice disclosed herein. It is intended that the specification and examples be considered as exemplary only, with a true scope and spirit being indicated by the following claims.

What is claimed is:

1. A heatsink having enhanced localized cooling, said heatsink comprising:
    a wall;
    a heatframe,
    a coolant channel between the wall and the heatframe, wherein a coolant flows through the coolant channel; and
    a porous media having a volume, wherein at least a portion of the volume of the porous media extends through the heatframe, through the coolant channel, and through the wall, wherein seal plates seal the heatframe and the wall so that the coolant does not flow through the porous media and out the heatframe or out the wall,
    wherein the wall and/or the heatframe proximate to the porous media provides enhanced localized cooling to at least a portion of a heat producing device that is at least in partial contact with the wall or the heatframe proximate to the porous media.

2. The heatsink of claim 1, wherein the seal plates are comprised of copper.

3. The heatsink of claim 1, wherein the heat producing device is at least in partial contact with at least one of the seal plates and the at least one of the seal plates provides enhanced localized cooling to at least a portion of the heat producing device that is at least in partial contact with the at least one of the seal plates.

4. The heatsink of claim 1, wherein the porous media is comprised of thermally-conductive material having a thermal-conductivity rating of equal to or greater than 150 W/mK.

5. The heatsink of claim 1, wherein the porous media is comprised of material configured to cause turbulence in the coolant flow through the portion of the porous media extending into the coolant channel comprising 3D printed metal porous media, a metal foam, or a wire mesh.

6. The heatsink of claim 5, wherein the porous media has a heat transfer coefficient of 20,000 W/m$^2$K, or greater.

7. The heatsink of claim 1, wherein the heat producing device comprises one or more of a central processing unit (CPU), a graphics processing unit (GPU), a field-programmable gate array (FPGA), a platform control hub (PCH), or a PCI express switch.

8. The heatsink of claim 1, wherein the coolant is a gas (ambient, compressed, or refrigerated), or the coolant is a liquid.

9. A cooling module for providing enhanced localized cooling of a portion of a heatsink, said module comprising:
   a porous media having a volume;
   wherein at least a portion of the volume of the porous media extends through a wall, through a coolant channel that is located between the wall and a heatframe of the heatsink, and through the heatframe, such that at least some of the coolant flows through the portion of the porous media extending into the coolant channel,
   two seal plates proximate to the porous media, wherein one seal plate that provides a seal for the wall and a second seal plate that seals the heatframe so that the coolant does not flow through the porous media and out the wall or out the heatframe,
   wherein at least a portion of one of the two seal plates proximate to the porous media provides enhanced localized cooling to at least a portion of a heat producing device that is at least in partial contact with the at least the portion of the one of the two seal plates.

10. The cooling module of claim 9, wherein at least one of the two seal plates is comprised of copper.

11. The cooling module of claim 9, wherein the porous media is mechanically connected with at least one of the two seal plates.

12. The cooling module of claim 9, wherein the porous media is comprised of thermally-conductive material having a thermal-conductivity rating equal to or greater than 150 W/mK.

13. The cooling module of claim 9, wherein the porous media is comprised of a material configured to cause turbulence in the coolant flow through the portion of the porous media extending into the coolant channel comprising a 3D printed metal porous media, a metal foam, or a wire mesh.

14. The cooling module of claim 13, wherein the porous media has a heat transfer coefficient of 20,000 W/m$^2$K, or greater.

15. The cooling module of claim 9, wherein the heat producing device comprises one or more of a central processing unit (CPU), a graphics processing unit (GPU), a field-programmable gate array (FPGA), a platform control hub (PCH), or a PCI express switch.

* * * * *